United States Patent
Nishimata et al.

(10) Patent No.: US 10,196,278 B2
(45) Date of Patent: Feb. 5, 2019

(54) ALUMINATE FLUORESCENT MATERIAL AND LIGHT EMITTING DEVICE

(71) Applicant: NICHIA CORPORATION, Anan-shi, Tokushima (JP)

(72) Inventors: Kazuya Nishimata, Anan (JP); Shoji Hosokawa, Tokushima (JP); Tomokazu Yoshida, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/667,975

(22) Filed: Aug. 3, 2017

(65) Prior Publication Data

US 2018/0037469 A1 Feb. 8, 2018

(30) Foreign Application Priority Data

Aug. 5, 2016 (JP) .................. 2016-154973

(51) Int. Cl.
| | |
|---|---|
| *C09K 11/08* | (2006.01) |
| *C01G 45/00* | (2006.01) |
| *C01F 1/00* | (2006.01) |
| *C09K 11/57* | (2006.01) |
| *C09K 11/64* | (2006.01) |
| *H01L 33/50* | (2010.01) |
| *H01J 61/44* | (2006.01) |

(52) U.S. Cl.
CPC .............. *C01G 45/006* (2013.01); *C01F 1/00* (2013.01); *C09K 11/576* (2013.01); *C09K 11/643* (2013.01); *H01L 33/50* (2013.01); *C01P 2004/03* (2013.01); *C01P 2006/60* (2013.01); *H01J 61/44* (2013.01)

(58) Field of Classification Search
CPC ....................... C09K 11/576; C09K 11/643
USPC ................................. 313/487, 486
See application file for complete search history.

(56) References Cited

U.S. PATENT DOCUMENTS

| | | | | |
|---|---|---|---|---|
| 4,005,328 A | * | 1/1977 | Radielovic | ......... C09K 11/7734 |
| | | | | 313/487 |
| 5,838,101 A | * | 11/1998 | Pappalardo | .......... C09K 11/595 |
| | | | | 313/485 |
| 5,868,963 A | | 2/1999 | Thi et al. | |

(Continued)

FOREIGN PATENT DOCUMENTS

| | | |
|---|---|---|
| JP | H10-001666 A | 1/1998 |
| JP | H10-053761 A | 2/1998 |
| JP | 2002-235074 A | 8/2002 |

(Continued)

OTHER PUBLICATIONS

S. Okamoto et al., "Photoluminescence Properties of BaMgAl10O17 Doped with High Concentration of Mn2+ for Blue-LED-Based Solid-State Lighting." Journal of the Electrochemical Society, 158 (11) J363-J367, 2011, 5 pages.

*Primary Examiner* — Christopher Raabe
(74) *Attorney, Agent, or Firm* — Hunton Andrews Kurth LLP

(57) ABSTRACT

Provided is an aluminate fluorescent material having a composition represented by the formula $X1_a Mg_b Mn_c Al_d O_{a+b+c+1.5d}$, in which X1 is at least one element selected from the group consisting of Ba, Sr; and Ca, a, b, c, and d satisfy $0.5 \leq a \leq 1.0$, $0.0 \leq b < 0.4$, $0.3 \leq c \leq 0.7$, $8.5 \leq d \leq 13.0$, and $9.0 \leq b+c+d \leq 14.0$.

7 Claims, 4 Drawing Sheets

(56) References Cited

U.S. PATENT DOCUMENTS 6,168,892 B1 * 1/2001 Ohara ................... B41M 1/18
                                                                106/420
6,967,440 B2 * 11/2005 Racine ................ C09K 11/643
                                                               252/301.4 R

FOREIGN PATENT DOCUMENTS

| JP | 2004-155907 A | 6/2004 |
| JP | 2004-244477 A | 9/2004 |
| JP | 2008-527151 A | 7/2008 |
| WO | 2006-098032 A1 | 9/2006 |
| WO | 2006-068141 A1 | 6/2008 |

\* cited by examiner

ALUMINATE FLUORESCENT MATERIAL AND LIGHT EMITTING DEVICE

CROSS-REFERENCE TO RELATED PATENT APPLICATION

The present application claims priority under 35 U. S. C. § 119 to Japanese Patent Application No. 2016-154973, filed Aug. 5, 2016, the disclosure of which is hereby incorporated by reference in its entirety.

BACKGROUND

Technical Field

The present disclosure relates to an aluminate fluorescent material and a light emitting device.

Description of Related Art

Various types of light emitting devices employing combinations of one or more light emitting diodes such as light emitting elements and one or more types of fluorescent materials to emit light of white color, incandescent lamp color, orange color and so on have been developed. These light emitting devices are configured to emit light of respective desired color based on the principle of light-color mixing. In some of these light emitting devices, a light emitting element configured to emit blue light is used as a light source and white light is generated in combination with a fluorescent material that emits green light and a fluorescent material that emits red light respectively upon being excited by the blue light from the light source.

Such light emitting devices are in demand in a wide range of fields such as general lighting, on-vehicle lighting, displays, and backlights for liquid crystal devices.

For example, in Japanese Unexamined Patent Application Publication No. 2004-155907, a manganese-activated aluminate fluorescent material represented by a composition $(Ba, Sr)MgAl_{10}O_{17}:Mn^{2+}$ is used as the fluorescent material that emits green light in the light emitting device.

SUMMARY

Color gamut defined by Digital Cinema Initiative (DCI) is one of specifications for evaluating color reproductivity of an image display device. The higher the DCI gamut coverage (%), the higher the color reproductivity of the image display device. The aluminate fluorescent material activated with manganese disclosed in Japanese Unexamined Patent Application Publication No. 2004-155907 is used in a light emitting device for backlight of liquid crystal that is a component of an image display device. However, the color of light emitted from the aluminate fluorescent material is outside of the DCI color gamut shown in the color coordinates, and thus reducing the DCI gamut coverage. Thus, there is a need to improve the chromaticity of the aluminate fluorescent material in order to improve its DCI gamut coverage.

Accordingly, an object of one embodiment according to the present disclosure is to provide an aluminate fluorescent material to emit green light with improved chromaticity and a light emitting device with good color reproductivity when used for the backlight of liquid crystal.

Specific examples for achieving this object will be described below. The present disclosure includes embodiments as described below.

A first embodiment of the present disclosure provides an aluminate fluorescent material having a composition represented by formula (I) below.

$$X1_aMg_bMn_cAl_dO_{a+b+c+1.5d} \qquad (I)$$

In the formula (I), X1 is at least one element selected from the group consisting of Ba, Sr, and Ca, and a, b, c, and d satisfy $0.5 \leq a \leq 1.0$, $0.0 \leq b < 0.4$, $0.3 \leq c \leq 0.7$, $8.5 \leq d \leq 13.0$, and $9.0 \leq b+c+d \leq 14.0$.

A second embodiment of the present disclosure provides a light emitting device including the aluminate fluorescent material having the composition represented by the formula (I) and an excitation light source.

According to embodiments of the present disclosure, an aluminate fluorescent material to emit green light with improved chromaticity and a light emitting device with good color reproductivity when used for the backlight of liquid crystal, may be provided.

DETAILED DESCRIPTION

Figure 1:
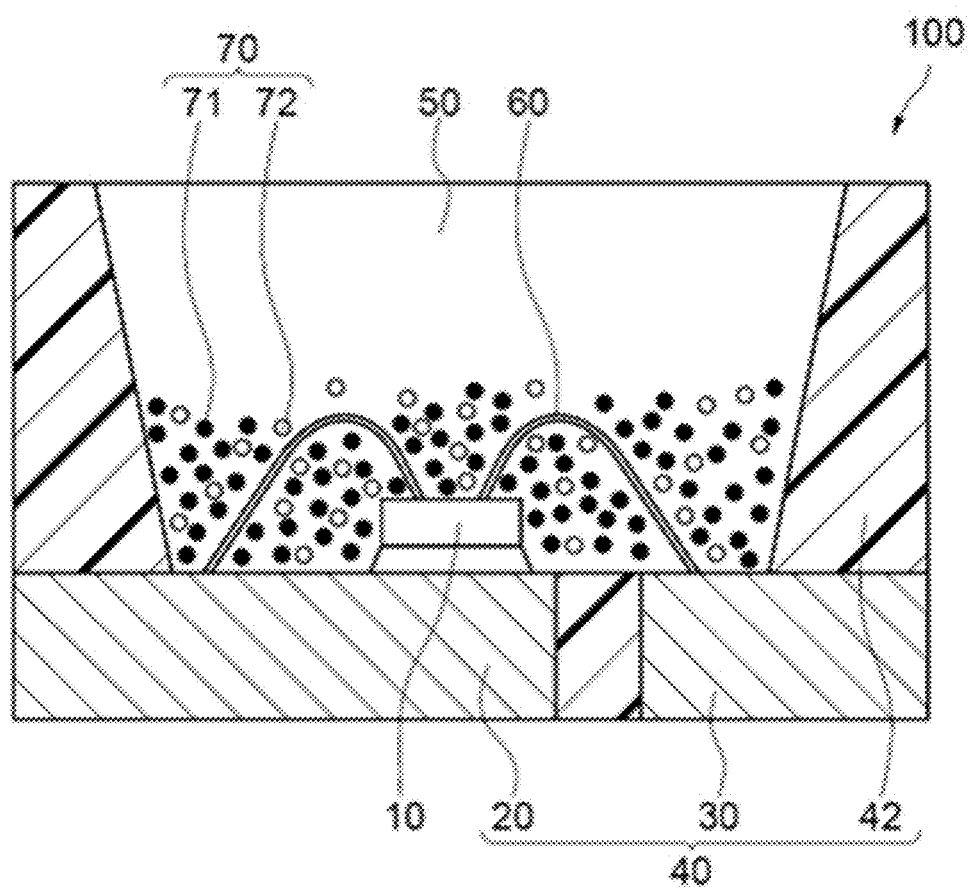
FIG. 1 is a schematic cross-sectional view showing an example a light emitting device.

An aluminate fluorescent material and a light emitting device using the aluminate fluorescent material, according to embodiments of the present disclosure, will be described below. The embodiments are intended as illustrative of concrete forms to technical ideas of the present invention, and the scope of the invention is not limited to the aluminate fluorescent materials and light emitting devices described below. The relation between the color names and the chromaticity coordinates, the relation between the range of wavelength of light and the color name of single color light, and the like conform to JIS Z8110. Further, the "content of each component in the composition" indicates that in the case where a plural number of substances corresponding to each component are present in the composition, refers to a total amount of the plural number of substance in the composition.

Aluminate Fluorescent Material

An aluminate fluorescent material according to an embodiment of the present disclosure has a composition represented by formula (I) shown below.

$$X1_aMg_bMn_cAl_dO_{a+b+c+1.5d} \qquad (I)$$

In the formula (I), X1 is at least one element selected from the group consisting of Ba, Sr, and Ca, and a, b, c, and d satisfy $0.5 \leq a \leq 1.0$, $0.0 \leq b < 0.4$, $0.3 \leq c \leq 0.7$, $8.5 \leq d \leq 13.0$, and $9.0 \leq b+c+d \leq 14.0$. X1 preferably contains Ba. An aluminate fluorescent material that contains Ba allows obtaining high emission luminance.

An aluminate fluorescent material according an embodiment of the present disclosure preferably has a composition represented by formula (II) shown below. In the description below, for the sake of convenience, the aluminate fluorescent material represented by formula (I) may also be referred to as "aluminate fluorescent material (I)" and the aluminate fluorescent material represented by formula (II) shown below may be referred to as "aluminate fluorescent material (II)".

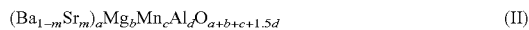

$$(Ba_{1-m}Sr_m)_aMg_bMn_cAl_dO_{a+b+c+1.5d} \quad (II)$$

In the formula (II), a, b, c, d and m satisfy 0.5≤a≤1.0, 0.0≤b<0.4, 0.3≤c≤0.7, 8.5≤d≤13.0, 9.0≤b+c+d≤14.0, and 0.0≤m≤1.0.

In the aluminate fluorescent material (I), the subscript "a" is a sum of molar composition ratios of at least one element selected from the group consisting of Ba, Sr, and Ca. In the aluminate fluorescent material (II), the subscript "a" in the formula is a sum of molar composition ratios of at least one element selected from the group consisting of Ba and Sr. When the subscript "a" in the formula (I) or (II) does not satisfy 0.5≤a≤1.0, the aluminate fluorescent material may have an unstable crystal structure, which may result in a reduction in the emission luminance. In either formula, the subscript "a" is a number preferably satisfying 0.60≤a≤0.98, preferably satisfying 0.80≤a≤0.97.

In the aluminate fluorescent materials, the subscript "b" is a molar composition ratio of Mg and, when "b" does not satisfy 0.0≤b<0.4, the relative emission intensity at 535 nm decreases. The subscript "b" is preferably 0.00≤b≤0.38, more preferably 0.00≤b≤0.35, further preferably 0.00≤b≤0.30, further more preferably 0.00≤b≤0.25, and particularly preferably 0.00≤b≤0.15. When the subscript "b" in the aluminate fluorescent materials (I) and (II) satisfies 0.0≤b<0.4, an emission spectrum of either the aluminate fluorescent materials, excited by light in a range of near-ultraviolet to blue region, has a peak emission intensity at a wavelength in a range of 515 nm to 523 nm, and a relative emission intensity at 535 nm in the emission spectrum with respect to the peak emission intensity can be in a range of 51% to 80%. Adjusting the aluminate fluorescent materials to have emission spectra having greater emission intensity than a conventional aluminate fluorescent material at a wavelength greater than the peak emission wavelength located in a range of 515 nm to 523 nm allows reproducing a wider range of colors on a chromaticity coordinates when the light emitting device with the aluminate fluorescent material is used as a backlight of liquid crystal in a liquid crystal display device.

Color reproductivity can be evaluated by, for example, a DCI gamut coverage (%). The DCI color gamut is shown as a triangle formed by three primary colors which are red (x=0.680, y=0.320), green (x=0.265, y=0.690), and blue (x=0.150, y=0.060) in the Commission internationale de l'éclairage (CIE) 1931 xy chromaticity diagram. The DCI color gamut was established by the Digital Cinema Initiative to evaluate color reproductivity of an image display device by a DCI gamut coverage (%) that is an area ratio of a triangle formed by single colors red, green, and blue produced by the image display device with respect to the DCI triangle. The higher the DCI gamut coverage (%), the higher the color reproductivity of the image display device.

An aluminate fluorescent material according to an embodiment of the present disclosure preferably has an emission spectrum under the excitation of light in near-ultraviolet region to blue region, more specifically, under the excitation of light of a wavelength range of 380 nm to 485 nm, in which a peak emission intensity is at a wavelength in a range of 515 nm to 523 nm, and a relative emission intensity at 535 nm in the emission spectrum with respect to the peak emission intensity is in a range of 51% to 80%.

An aluminate fluorescent material according to an embodiment of the present disclosure is adjusted to have a peak emission wavelength in a range of 515 nm to 523 nm under the excitation of light in the range described above, and thus can emit light of desired green color. With the composition represented by the formula (I), the aluminate fluorescent material (I) can produce an emission spectrum in which a relative emission intensity at 535 nm to the peak emission intensity can be increased to a range of 51% to 80%. As described above, the aluminate fluorescent material has an emission spectrum in which emission intensity at a wavelength greater than the peak emission wavelength located in a range of 515 nm to 523 nm is higher than that of conventional aluminate fluorescent materials, when a relative emission intensity at 535 nm is 51% or greater, light of an improved chromaticity can be produced, and when the aluminate fluorescent material is used in a liquid crystal display device, a wider range of color on the chromaticity coordinates can be reproduced.

Also, when the relative emission intensity at 535 nm of the emission spectrum of the aluminate fluorescent material is 80% or less, a spatial extent of the half band width can be reduced and the color purity of the fluorescent material can be maintained.

In the aluminate fluorescent materials (I) and (II), the subscript "c" is a mole composition ratio of Mn. When the subscript "c" does not satisfy 0.3≤c<0.7, when the aluminate fluorescent material is excited by light in a range of manganese-activated aluminate fluorescent material disclosed in Japanese Unexamined Patent Application Publication No. 2004-155907, a lower emission luminance may result. The manganese-activated aluminate fluorescent material disclosed in Japanese Unexamined Patent Application Publication No. 2004-155907 exhibits a lower emission luminance when excited by light in a range of near-ultraviolet to blue region. The reason is assumed to be that the manganese-activated aluminate fluorescent material disclosed in Japanese Unexamined Patent Application Publication No. 2004-155907 has an absorption rate of light in a range of near-ultraviolet to blue region lower than an absorption rate of vacuum ultraviolet rays. The aluminate fluorescent materials (I) and (II) respectively include manganese as an activator. When the aluminate fluorescent materials (I) and (II) are excited by manganese with an amount satisfying 0.3≤c<0.7, which is greater than the amount of the activator manganese, for example, disclosed in Japanese Unexamined Patent Application Publication No. 2004-159907, absorption of light in a range of near-ultraviolet to blue region is increased. Thus, high emission luminance can be maintained. Also, with the amount of the activator manganese satisfying 0.3≤c<0.7, occurrence of concentration quenching associated with an excess amount of activator can be reduced and high emission luminance can be maintained. In either formula, the subscript "c" is a number preferably satisfying 0.40≤c≤0.60, more preferably satisfying 0.45≤c≤0.55.

In the aluminate fluorescent materials (I) and (II), the subscript "d" is a mole composition ratio of Al. When the subscript "d" in the formula (I) or (II) does not satisfy 8.5≤d≤13.0, the aluminate fluorescent material may have an unstable crystal structure, which may result in a reduction in the emission luminance.

In either formula, the subscript "d" is a number preferably satisfying 9.0≤d≤13.0, more preferably satisfying 9.0≤d≤12.0, further preferably satisfying 9.0≤d≤11.0.

In the aluminate fluorescent materials (I) and (II), the sum of subscript "b", subscript "c", and subscript "d" is a number satisfying 9.0≤b+c+d≤14.0. When the sum of subscripts "b", "c", and "d" in the formula (I) or (II) does not satisfy $9.0 \leq b+c+d \leq 14.0$, the aluminate fluorescent material may have an unstable crystal structure, which may result in a reduction in the emission luminance.

Aluminate fluorescent materials according to embodiments of the present disclosure may be produced by using a flux such as a halide, in order to facilitate the reaction of the raw materials. At this time, if a flux containing an alkali metal element is used, a minute amount of the alkali metal element may be detected from the fluorescent materials. Even in such a case, as long as the principal component of the fluorescent material is of the aluminate fluorescent material according to an embodiment of the present disclosure, the fluorescent material is assumed to satisfy the formula (I) or (II). The alkali metal elements contained in the fluorescent material is preferably 1,000 ppm or less, more preferably 990 ppm or less, and preferably 100 ppm or more, more preferably 200 ppm or more, further preferably 300 ppm or more.

Aluminate fluorescent materials according to embodiments of the present disclosure can be excited by light in a range of near-ultraviolet to blue region, more specifically, can absorb light in a wavelength range of 380 nm to 485 nm, and emit light having a chromaticity with chromaticity coordinates in a range of $0.180 \leq x \leq 0.250$, $0.700 \leq y \leq 0.730$ in the CIE1931 color space.

An aluminate fluorescent material according to an embodiment of the present disclosure is activated with manganese (Mn) and, upon being excited by light in a range of near-ultraviolet to blue region, emits green light. More specifically, the aluminate fluorescent material absorbs light of a wavelength in a range of 380 nm to 485 nm and emits light having an emission spectrum in which the peak emission wavelength is preferably in a range of 485 nm to 570 nm, more preferably in a range of 505 nm to 550 nm, further preferably in a range of 515 nm to 523 nm.

Aluminate fluorescent materials according to embodiments of the present disclosure can be excited by light in a range of near-ultraviolet to blue region, more specifically, can absorb light in a wavelength range of 380 nm to 485 nm, and emit light having a chromaticity with chromaticity coordinates in a range of $0.180 \leq x \leq 0.250$, $0.700 \leq y \leq 0.730$ in the CIE1931 color space.

An aluminate fluorescent material according to an embodiment of the present disclosure thus emits green light with the chromaticity coordinates of x=0.210 and y=0.710, which is in the green region in the CIE1931 color space that is proposed by National Television System Committee (NTSC).

The chromaticity coordinates of light emitted from an aluminate fluorescent material according to an embodiment of the present disclosure is more preferably in a range of $0.182 \leq x \leq 0.230$, $0.710 \leq y \leq 0.729$, further preferably in a range of $0.185 \leq x \leq 0.225$, $0.710 \leq y \leq 0.725$ in the CIE1931 color space.

An aluminate fluorescent material according to an embodiment of the present disclosure has an average particle diameter preferably in a range of 5.0 µm to 35.0 µm, more preferably in a range of 10.0 µm to 30.0 µm, further preferably in a range of 12.0 µm to 25.0 µm, further more preferably in a range of 15.0 µm to 25.0 µm. With such an aluminate fluorescent material, high reflectance to the light from the excitation light source can be obtained, which can contribute an increase in the relative emission luminance. The average particle diameter of fluorescent material particles is represented by a volume-cumulative (50%) average particle size (D50: median diameter) measured by using a laser diffraction-type particle-size distribution measuring device (for example, MASTER SIZER 3000, manufactured by Malvern Instruments Ltd).

Light Emitting Device

An example of a light emitting device using one of the aluminate fluorescent materials described above will be described below with reference to the drawings. FIG. 1 is a schematic cross-sectional view showing a structure of a light emitting device 100 according to an embodiment of the present disclosure.

The light emitting device 100 includes a molded member 40 and at least one light emitting element 10, and a fluorescent material member 50. The molded body 40 is formed by integrally molding a first lead 20 and a second lead 30 with a resin part 42 that contains thermoplastic resin or thermosetting resin. A recess defined by a bottom surface and one or more side surfaces is formed in the molded body 40 and the light emitting element 10 is mounted on the bottom surface defining the recess. The light emitting element 10 has positive and negative electrodes that are electrically connected to the first lead 20 and the second lead 30 through wires 60, respectively. The light emitting element 10 is covered by a fluorescent material member 50. The fluorescent material member 50 contains, for example, a fluorescent material 70 to convert the wavelength of light from the light emitting element 10. Further, the fluorescent material 70 includes a first fluorescent material 71 and a second fluorescent material 72. The first lead 20 and the second lead 30 electrically connected to the positive and negative electrodes of the light emitting element 10 are partially exposed outward of the package that is a constituent member of the light emitting device 100. Through the first lead 20 and the second lead 30, the electric power is supplied from the outside to cause the light emitting device 100 to emit light.

The light emitting element 10 is used as an excitation light source and preferably has a peak emission wavelength in a wavelength range of 380 nm to 485 nm. The range of the peak emission wavelength of the light emitting element 10 is more preferably 390 nm to 480 nm, further preferably 420 nm to 470 nm. The aluminate fluorescent material described above can be efficiently excited by light from the excitation light source that has a peak emission wavelength in a range of 380 nm to 485 nm, and emits light of high emission luminance. The use of the aluminate fluorescent material having high emission luminance allows for obtaining of the light emitting device 100 that can emit light of mixed color of the light emitted from the light emitting element 10 and fluorescent light emitted from the fluorescent material 70.

The light emitting element 10 has an emission spectrum with a half band width of, for example, 30 nm or less.

For the light emitting element 10, a semiconductor light emitting element can be preferably used. With the use of a semiconductor light emitting element as an excitation light source, a highly efficient and stable light emitting device that has high output-input linearity and high mechanical shock resistance can be obtained.

The semiconductor light emitting element may be, for example, a semiconductor light emitting element that uses a nitride-based semiconductor ($In_XAl_YGa_{1-X-Y}N$, $0 \leq X$, $0 \leq Y$, $X+Y \leq 1$).

The light emitting device 100 includes at least the aluminate fluorescent material described above.

The first fluorescent material 71 mainly includes the aluminate fluorescent material described above, which is, for example, contained in a fluorescent material member 50 covering the light emitting element 10. In the light emitting device 100 having the light emitting element 10 covered by the fluorescent material member 50 including the first fluorescent material 71, a portion of light emitted from the light emitting element 10 is absorbed by the aluminate fluorescent material and re-emitted as green light. With the use of the light emitting element 10 configured to emit light having a peak emission wavelength in a range of 380 nm to 485 nm, the light emitting device 100 of high luminous efficiency can be provided.

The content of the first fluorescent material 71 can be, for example, with respect to 100 pts.mass of resin, in a range of 10 pts.mass to 200 pts.mass, preferably 2 pts.mass to 40 pts.mass.

The fluorescent material member 50 preferably contains a second fluorescent material 72 having a peak emission wavelength different from that of the first fluorescent material 71. For example, the light emitting device 100 can be provided with a wide color reproduction range and high color rendering properties by using the light emitting element 10 configured to emit light having a peak emission wavelength in a range of 380 nm to 485 nm, and the first fluorescent material 71 and the second fluorescent material 72 respectively can be excited by the light from the light emitting element 10.

The second fluorescent material 72 can absorb light emitted from the light emitting element 10 and convert it to light having a wavelength different from that of the first fluorescent material 71. Examples of the second fluorescent material include (Ca, Sr, Ba)$_2$SiO$_4$:Eu, (Ca, Sr, Ba)$_8$MgSi$_4$O$_{16}$(F, Cl, Br)$_2$:Eu, Si$_{6-z}$Al$_z$O$_z$N$_{8-z}$:Eu(β-sialon), (Sr, Ba, Ca)Ga$_2$S$_4$:Eu, (Lu, Y, Gd, Lu)$_3$(Ga, Al)$_5$O$_{12}$:Ce, (La, Y, Gd)$_3$Si$_6$N$_{11}$:Ce, Ca$_3$Sc$_2$Si$_3$O$_{12}$:Ce, CaSc$_4$O$_4$:Ce, K$_2$(Si, Ge, Ti)F$_6$:Mn, (Ca, Sr, Ba)$_2$Si$_5$N$_8$:Eu, CaAlSiN$_3$:Eu, (Ca, Sr)AlSiN$_3$:Eu, (Sr, Ca)LiAl$_3$N$_4$:Eu, (Ca, Sr)$_2$Mg$_2$Li$_2$Si$_2$N$_6$:Eu, and 3.5MgO.0.5MgF$_2$.GeO$_2$:Mn.

When the fluorescent material member 50 further contains the second fluorescent material 72, the second fluorescent material 72 is preferably a red fluorescent material to emit red light, which absorb light in a wavelength range of 380 nm to 485 nm and emit light in a wavelength range of 610 nm to 780 nm. The light emitting device including such a red fluorescent material can be applied more suitably to lighting devices, liquid crystal display devices, and so forth.

Examples of the red fluorescent material include tetravalent Mn activated fluorescent materials represented by composition formulas K$_2$SiF$_6$:Mn, 3.5MgO.0.5MgF$_2$.GeO$_2$:Mn, bivalent Eu activated fluorescent materials represented by composition formulas CaSiAlN$_3$:Eu, (Ca, Sr)AlSiN$_3$:Eu, and SrLiAl$_3$N$_4$:Eu. Of those, the red fluorescent material is preferably a tetravalent Mn activated fluorescent material having a half value width of the emission spectrum 20 nm or less, in view of expanding the color reproduction range.

The first fluorescent material 71 and the second fluorescent material 72 (hereinafter may be simply referred to as "fluorescent material 70") with a sealing member constitute the fluorescent material member 50 that cover the light emitting element. Examples of the sealing material constituting the fluorescent material member 50 include thermosetting resin such as silicone resin and epoxy resin.

The total content of the fluorescent material 70 in the fluorescent material member 50 can be, for example, with respect to 100 pts.mass of resin, in a range of 5 pts.mass to 300 pts.mass, preferably 10 pts.mass to 250 pts.mass, more preferably 15 pts.mass to 230 pts.mass, further preferably 15 pts.mass to 200 pts.mass. With the total content of the fluorescent material in the fluorescent material member 50 being in such a range described above, the wavelength of light emitted from the light emitting element 10 can be sufficiently converted by the fluorescent material 70.

The fluorescent material member 50 may further contain one or more optional materials such as a filler and a light diffusing material, in addition to the sealing material and the fluorescent material 70. For example, with a light diffusion agent contained in the fluorescent material member 50, the directivity of light from the light emitting element 10 can be relaxed, allowing an expansion of the viewing angle. Examples of the filler include silica, titanium oxide, zinc oxide, zirconium oxide, and alumina. For example, when the fluorescent material member 50 includes a filler, the content of the filler can be in a range of 1 pts.mass to 20 pts.mass with respect to 100 pts.mass of resin.

Method of Manufacturing Aluminate Fluorescent Material

A method of manufacturing an aluminate fluorescent material according an embodiment of the present disclosure will be described below. The aluminate fluorescent material can be manufactured by using compounds containing the elements that constitute the composition of the aluminate fluorescent material.

Compounds Containing Elements Constituting Composition of Aluminate Fluorescent Material Examples of the compounds containing the elements that constitute the composition of the aluminate fluorescent material include at least one compound selected from the group consisting of compounds containing barium (Ba), compounds containing strontium (Sr), and compounds containing calcium (Ca), and optionally, one or more compounds that include compounds containing magnesium (Mg), compounds containing manganese (Mn), and compounds containing aluminum (Al).

Compound Containing Barium, etc.

Examples of compounds containing at least one element selected from the group consisting of Ba, Sr, and Ca include oxides, hydroxides, carbonates, nitrates, sulphates, carboxylates, halides, and nitrides, each including at least one element selected from the group consisting of Ba, Sr, and Ca. Hydrate of those compounds may also be used. Specific examples thereof include BaO, Ba(OH)$_2$.8H$_2$O, BaCO$_3$, Ba(NO$_3$)$_2$, BaSO$_4$, Ba(OCO)$_2$.2H$_2$O, Ba(OCOCH$_3$)$_2$, BaCl$_2$.6H$_2$O, Ba$_3$N$_2$, BaNH, SrO, Sr(OH)$_2$.8H$_2$O, SrCO$_3$, Sr(NO$_3$)$_2$.4H$_2$O, SrSO$_4$, Sr(OCO)$_2$.H$_2$O, Sr(OCOCH$_3$)$_2$.0.5H$_2$O, SrCl$_2$.6H$_2$O, Sr$_3$N$_2$, SrNH, CaO, Ca(OH)$_2$, CaCO$_3$, Ca(NO$_3$)$_2$, CaSO$_4$, Ca(OCO)$_2$, CaCl$_2$, and Ca$_3$N$_2$. One of those compounds may be used singly or a combination of two or more of those compounds may be used. Among those, carbonates and oxides are preferable from the viewpoint of easy handling. Carbonates are more preferable, because carbonates are stable in the air and can be easily decomposed by heating while hardly leaving residues of the elements other than the intended elements, which allows for a reduction in the emission luminance caused by such residues of elements.

Compound Containing Magnesium

Examples of optional compounds that contain magnesium include oxides, hydroxides, carbonates, nitrates, sulphates, carboxylates, halides, and nitrides, each containing magnesium. Hydrates of those compounds containing magnesium may be employed. Specific examples thereof include MgO, Mg(OH)$_2$, 3MgCO$_3$.Mg(OH)$_2$.3H$_2$O, MgCO$_3$.Mg(OH)$_2$.nH$_2$O, Mg(NO$_3$)$_2$.6H$_2$O, MgSO$_4$, Mg(OCO)$_2$.H$_2$O, Mg(OCOCH$_3$)$_2$.4H$_2$O, MgCl$_2$, Mg$_3$N$_2$, and MgNH. One of those compounds containing Mg may be used singly or a combination of two or more types of those compounds may be used. Among those, carbonates and oxides are preferable from the viewpoint of easy handling. Oxides containing Mg (e.g., MgO) are more preferable because oxides containing Mg are stable in the air and can be easily decomposed by heating while hardly leaving residues of the elements other than the intended elements, which allows for a reduction in the emission luminance caused by such residues of elements.

Compound Containing Manganese

Examples of compounds containing manganese include oxides, hydroxides, carbonates, nitrates, sulphates, carboxylates, halides, and nitrides, each containing manganese. Hydrates of those manganese-containing compounds may also be employed. Specific examples thereof include $MnO_2$, $Mn_2O_2$, $Mn_3O_4$, $MnO$, $Mn(OH)_2$, $MnCO_3.Mn(NO_3)_2$, $Mn(OCOCH_3)_2.2H_2O$, $Mn(OCOCH_3)_3.nH_2O$, and $MnCl_2$ $4H_2O$. One manganese-containing compound may be used singly or two or more manganese-containing compounds may be used in combination. Among those, carbonates and oxides are preferable from the viewpoint of easy handling. Carbonates containing Mn (e.g., $MnCO_3$) are more preferable because carbonates containing Mn are stable in the air and can be easily decomposed by heating while hardly leaving residues of the elements other than the intended elements, which allows for a reduction in the emission luminance caused by such residues of elements.

Compound Containing Aluminum

Examples of compounds containing aluminum include oxides, hydroxides, nitrides, oxynitrides, fluorides, and chlorides, each containing aluminum. Hydrate of those compounds may also be used. Substituting a part of an aluminum-containing compound, a single metal of aluminum or aluminum alloy may also be used.

More specific examples of compounds containing Al include $Al_2O_3$, $Al(OH)_3$, $AlN$, $AlON$, $AlF_3$, and $AlCl_3$. One aluminum-containing compound may be used singly or two or more aluminum-containing compounds may be used in combination. For the compounds containing Al, oxides (i.e., $Al_2O_3$) are preferable. This is because, compared to other compounds, oxides containing aluminum do not contain elements other than intended elements for the composition of the aluminate fluorescent material, which facilitates obtaining of the fluorescent material of intended composition. If a compound that contains one or more elements that are not constituent elements of the intended composition is used, the resulting fluorescent material may contain residual contamination elements that may adversely affect light emission, resulting in a significant reduction in the emission luminance.

In order to facilitate the reaction of the raw materials, a flux such as a halide may be optionally included in the raw materials. When such a flux is contained in the raw materials, reaction between the raw materials can be accelerated, facilitating uniform proceeding of the solid reaction. It is thought that the temperature of heat processing the raw materials is approximately the same as generation temperature of liquid phase of halide used as the flux, or higher than the generation temperature of the liquid phase, which accelerates the reaction.

Examples of halide include fluorides or chlorides of rare earth metals, alkaline-earth metals, and alkali metals, and fluorides and chlorides of aluminum. When a compound containing one or more constitutive element of the aluminate fluorescent material is used as the flux, a compound containing elemental ratio of cations corresponding to the elemental ratio of the aluminate fluorescent material intended to obtain may be added as the flux, or providing each raw materials corresponding to the composition of the aluminate fluorescent material intended to obtain, and the flux can be further added. When a halide of alkaline-earth metal is used as the flux, the flux can be added as a compound having the composition that can provide the composition of the aluminate fluorescent material intended to be obtained. Specific examples of the flux include barium fluoride ($BaF_2$), magnesium fluoride ($MgF_2$), calcium fluoride ($CaF_2$), lithium fluoride (LiF), sodium fluoride (NaF), pottasium fluoride (KF), and aluminum fluoride ($AlF_3$). For the flux, magnesium fluoride ($MgF_2$), sodium fluoride (NaF), and aluminum fluoride ($AlF_3$) are preferable. When magnesium fluoride or sodium fluoride is used as the flux, crystal structure can be stabilized and fluorescent material of relatively large average particle diameter can be obtained.

When the raw material mixture contains a flux, the content of the flux is preferably 10 mass % or less, more preferably 5 mass % or less, further preferably 2 mass % or less, and preferably 0.1 mass % or more, with respect to 100 mass % of the raw material mixture. When the content of the flux is in the range as shown above, difficulty in formation of crystal structure due to insufficient particle growth caused by insufficient amount of the flux or difficulty in formation of crystal structure due to excessive amount of the flux can be avoided.

When a halide containing an alkali metal is used as the flux, a minute amount of alkali metal element may be contained in the obtained aluminate fluorescent material. The alkali metal element contained in the aluminate fluorescent material is preferably at least one element selected from the group consisting of Li, K, and Na, more preferably Na is contained.

Mixing of Compounds

Compounds of one or more elements selected from Ba, Sr, and Ca, a compound containing Mn, a compound containing Al, and optionally, a compound containing Mg are used as the raw materials and mixed at a mole ratio satisfying the composition of the formula (I) to obtain a raw material mixture. More specific examples of the target composition include $Ba_{1.0}Mg_{0.35}Mn_{0.5}Al_{10}O_{16.85}$. A flux may be added in the raw material mixture. The amount of the flux in the raw material mixture is preferably 1 mole or less, preferably 0.5 mole or less, more preferably 0.2 mole or less, and preferably 0.05 mole or more, with respect to 1 mole of element selected from the group consisting of Ba, Ca, and Sr contained in the raw material mixture. When two or more types of flux are added, the amount of the flux in the raw material mixture is preferably in the range shown above, as the total mole of the two-types of flux.

The raw material mixture may be obtained by measuring compounds containing the constituting elements to obtain an intended compounding ratio, then pulverizing and mixing by using a dry pulverization machine, for example, a ball mill, a vibration mill, a hammer mill, a roll mill, a jet mill, or the like, or pulverizing by using a mortar and a pestle, or mixing by using a mixing machine, for example, a ribbon blender, a henschel mixer, a V-blender, or the like, or pulverizing and mixing by using both a dry pulverization machine and a mixing machine. The mixing may be dry-mixing or wet mixing with a solvent. For the mixing, dry mixing is preferable. Compared to a wet mixing, a dry mixing can reduce operation time, contributing to an improvement in the productivity.

Heat Treatment of Raw Material Mixture

The raw material mixture can be placed in a crucible, a boat, or the like, made of carbon material such as graphite, boron nitride (BN), aluminum oxide (alumina), tungsten (W), molybdenum (Mo) or the like, and subjected to heat treatment.

The heat treatment temperature of the raw material mixture is, in view of stability of the crystal structure, preferably in a range of 1000° C. to 1800° C., more preferably in a range of 1100° C. to 1750° C., further preferably in a range of 1200° C. to 1700° C., particularly preferably in a range of 1300° C. to 1650° C.

The duration of heat treatment differs according to the temperature rising speed, calcining atmosphere, and the like, and after reaching the heat treatment temperature, the duration is preferably 1 hour or longer, more preferably 2 hours or longer, further preferably 3 hours or longer, and preferably 20 hours or less, more preferably 18 hours or less, further preferably 15 hours or less.

The atmosphere of heat treating the raw material mixture may be an inert atmosphere using argon, nitrogen, and the like, a reducing atmosphere containing hydrogen or the like, or an oxidizing atmosphere such as air. The raw material mixture is preferably heat treated in a nitrogen atmosphere that has reduction property to obtain the fluorescent material. The atmosphere of heat treating the raw material mixture is more preferably a nitrogen atmosphere containing hydrogen gas that has reduction property.

In the case of an aluminate fluorescent material, the reactivity of the raw material mixture is higher in an atmosphere having high reducing power such as a reducing atmosphere containing hydrogen and nitrogen, allowing for conducting a heat treatment under atmospheric pressure without pressurizing. For the heat treatment, for example, an electric furnace, a gas furnace, or the like can be used.

Post-Treatment

The obtained fluorescent material may be subjected to post-treatment, in which the fluorescent material may be wet-dispersed, wet-sieved, dehydrate, dried, and dry-sieved. Through such post-treatment, the fluorescent material of desired average particle diameter can be obtained. For example, the fluorescent material after the heat treatment is dispersed in a solvent. The dispersed fluorescent material is placed on a sieve and wet-sieving is performed by applying a continuous flow of a solvent while applying various kinds of vibrations, then, dehydration, drying, and dry-sieving are performed to obtain a fluorescent material having a desired average particle size.

By dispersing the fluorescent material after heat treatment in the solvent, impurities such as the residue of flux after calcining and unreacted raw materials can be removed. For the wet-sieving, alumina balls, zirconia balls, or the like may be used for dispersion.

EXAMPLES

Specific descriptions will be given in accordance to examples below.

Example 1

The raw materials $BaCO_3$, $Al_2O_3$, MgO, and $MnCO_3$, were measured at a predetermined ratio to obtain a composition $Ba_{1.0}Mg_{0.35}Mn_{0.5}Al_{10}O_{16.85}$ and further $MgF_2$ and NaF were added as a flux, and mixed to obtain a raw material mixture.

The obtained raw material mixture was placed in an alumina crucible and the crucible was covered with a lid. Then, in a mixed atmosphere containing 3 volume % of $H_2$ and 97 volume % of $N_2$, heat treatment was performed at 1500° C. for 5 hours to obtain the aluminate fluorescent material of Example 1.

Comparative Example 1

The aluminate fluorescent material of Comparative Example 1 was obtained in a same manner as in Example 1, except that the raw materials were measured at a predetermined ratio to obtain a composition $Ba_{1.0}Mg_{0.5}Mn_{0.5}Al_{10}O_{17}$.

Comparative Example 2

The aluminate fluorescent material of Comparative Example 2 was obtained in a same manner as in Example 1, except that the raw materials were measured at a predetermined ratio to obtain a composition $Ba_{1.0}Mg_{0.45}Mn_{0.5}Al_{10}O_{16.95}$.

Comparative Example 3

The aluminate fluorescent material of Comparative Example 3 was obtained in a same manner as in Example 1, except that the raw materials were measured at a predetermined ratio to obtain a composition $Ba_{1.0}Mg_{0.40}Mn_{0.5}Al_{10}O_{16.90}$.

Example 2

The aluminate fluorescent material of Example 2 was obtained in a same manner as in Example 1, except that the raw materials were measured at a predetermined ratio to obtain a composition $Ba_{1.0}Mg_{0.30}Mn_{0.5}Al_{10}O_{16.80}$.

Example 3

The aluminate fluorescent material of Example 3 was obtained in a same manner as in Example 1, except that the raw materials were measured at a predetermined ratio to obtain a composition $Ba_{1.0}Mg_{0.10}Mn_{0.5}Al_{10}O_{16.60}$.

Example 4

The aluminate fluorescent material of Example 4 was obtained in a same manner as in Example 1, except that the raw materials were measured at a predetermined ratio to obtain a composition $Ba_{1.0}Mn_{0.5}Al_{10}O_{16.50}$, and $AlF_3$ and NaF were added as a flux.

Example 5

The aluminate fluorescent material of Example 5 was obtained in a same manner as in Example 1, except that the raw materials were measured at a predetermined ratio to obtain a composition $Ba_{1.0}Mn_{0.5}Al_{11.5}O_{18.75}$, and $AlF_3$ and NaF were added as a flux.

Table 1 shows the ratio of raw materials and flux used to obtain the aluminate fluorescent materials of Examples 1 to 5 and Comparative Examples 1 to 3.

TABLE 1

| | Raw Material Ratio (mol) | | | | Flux (mol) | | |
| | a Ba | b Mg | c Mn | d Al | $MgF_2$ | $AlF_2$ | NaF |
|---|---|---|---|---|---|---|---|
| Comparative Example 1 | 1.00 | 0.50 | 0.50 | 10.00 | 0.10 | — | 0.05 |
| Comparative Example 2 | | 0.45 | | | | | |

TABLE 1-continued

| | Raw Material Ratio (mol) | | | | Flux (mol) | | |
|---|---|---|---|---|---|---|---|
| | a Ba | b Mg | c Mn | d Al | MgF$_2$ | AlF$_2$ | NaF |
| Comparative Example 3 | | 0.40 | | | | | |
| Example 1 | | 0.35 | | | | | |
| Example 2 | | 0.30 | | | | | |
| Example 3 | | 0.10 | | | | | |
| Example 4 | | 0.00 | | | — | | 0.067 |
| Example 5 | | 0.00 | | | 11.50 | | |

Figure 2:
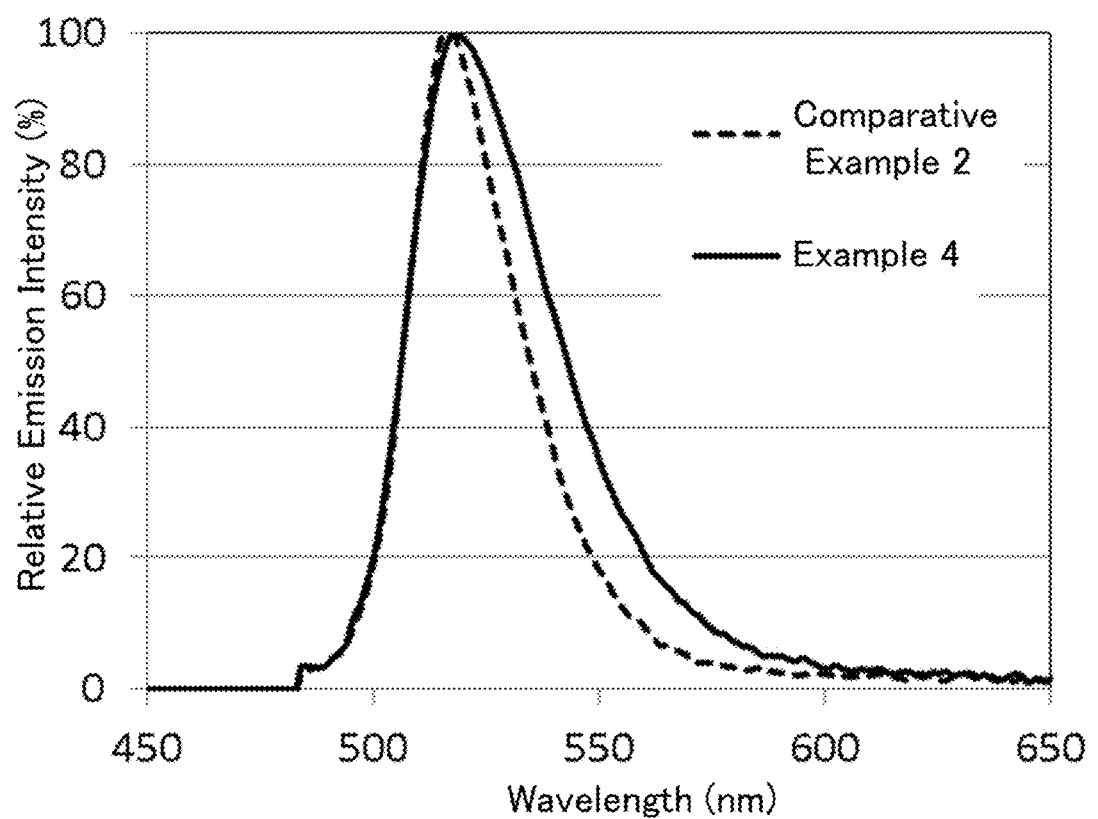
FIG. 2 is a diagram showing emission spectra of aluminate fluorescent materials according to an example of the present disclosure and a comparative example.

Evaluation of Luminous Characteristics
Relative Emission Intensity (%) at 535 nm Relative emission intensity of each fluorescent material of the Examples and the Comparative Examples was measured. With the use of a quantum efficiency measurement system (manufactured by Otsuka Electronics Co., LTD., QE-2000), excitation light having a wavelength of 450 nm was irradiated on each fluorescent material and the emission spectrum at room temperature (25° C. ±5° C.) was measured. The relative emission intensity at 535 nm of each emission spectrum was calculated with the emission intensity at the peak emission wavelength set to 100%. The results are shown in Table 2. FIG. 2 is a diagram showing emission spectra of the relative emission intensities (%) to the (emission) wavelengths of the aluminate fluorescent materials according to Example 4 and Comparative Example 2.

Peak Emission Wavelength

The peak emission wavelength (nm) of each of the aluminate fluorescent materials of the Examples and Comparative Examples was measured as the wavelength of maximum emission intensity of each fluorescent material as the peak emission wavelength (nm). The results are shown in Table 2.

Emission Chromaticity

The chromaticity coordinates x and y in the CIE1931 color space of each of the aluminate fluorescent materials of the Examples and Comparative Examples were measured by using a quantum efficiency measurement system (manufactured by Otsuka Electronics Co., LTD., QE-2000). The results are shown in Table 2.

Evaluation of Average Particle Diameter

The average particle diameter (Dm: median particle size) of each of the aluminate fluorescent materials of the Examples and Comparative Examples was measured by using a laser diffraction-type particle-size distribution measuring device (MASTER SIZER 3000, manufactured by Malvern Instruments Ltd), where the volume-cumulative from the smaller particle side reaches 50%. The results are shown in Table 2.

Composition Analysis

Using an ICP optical emission spectrometry, each of the aluminate fluorescent materials of the Examples and Comparative Examples were measured to determine the amounts of Ba, Mg, Al, Mn, and Na. The results are shown in Table 2.

SEM Image

Figure 3:
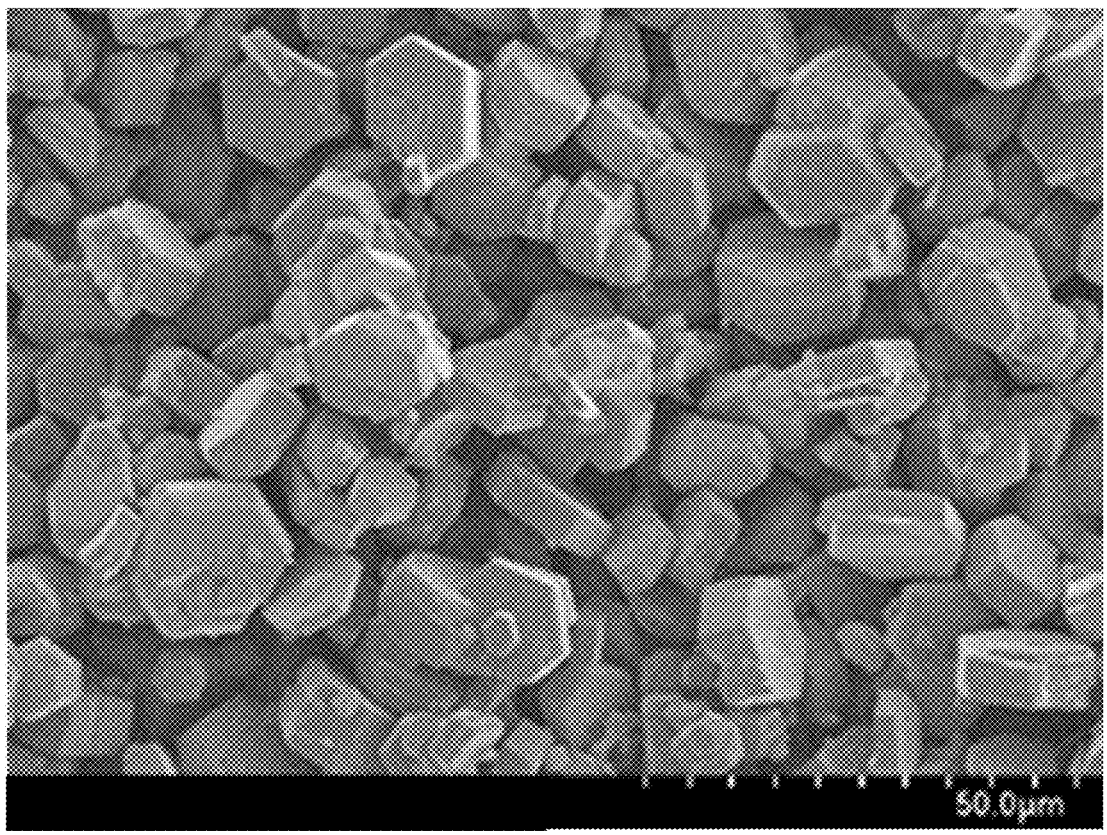
FIG. 3 is a scanning electron microscope (SEM) image of an aluminate fluorescent material according to an example of the present disclosure.
Figure 4:
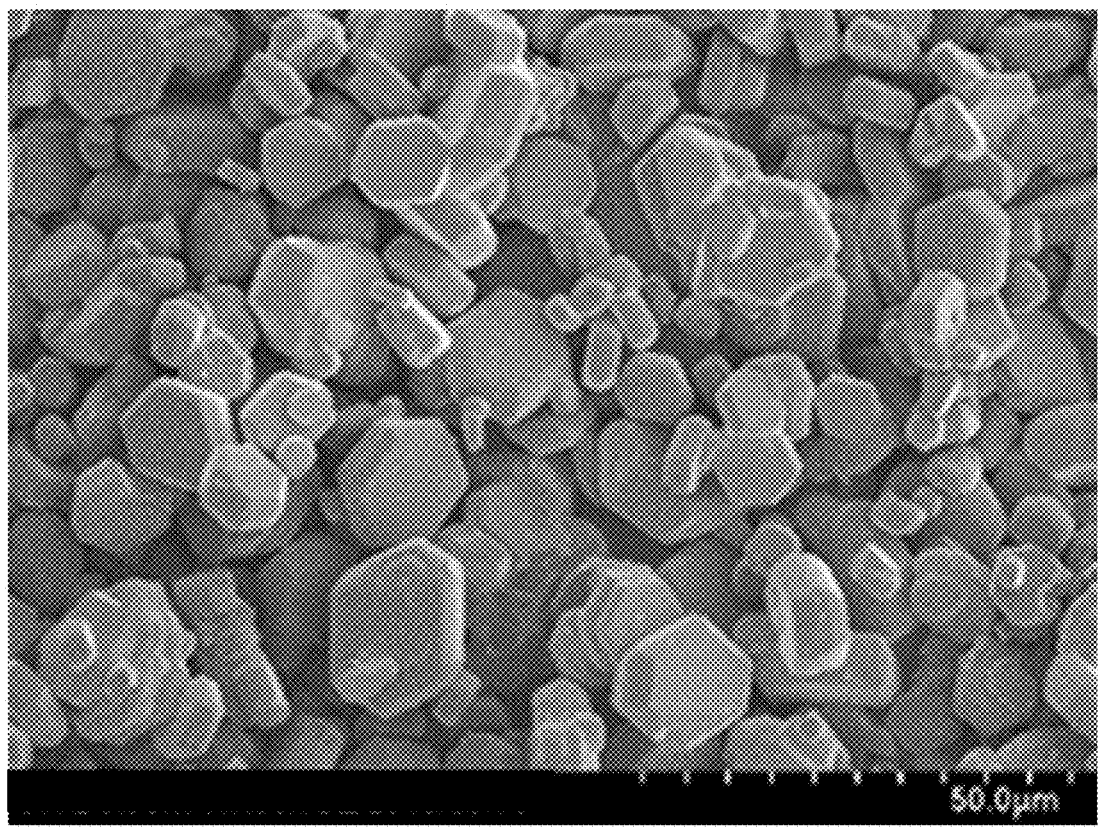
FIG. 4 is a SEM image of an aluminate fluorescent material according to a comparative example.

With the use of a scanning electron microscope (SEM), SEM images of the aluminate fluorescent material of Example 3 and the aluminate fluorescent material of Comparative Example 2 were obtained. FIG. 3 is a SEM image of the aluminate fluorescent material according to Example 3 and FIG. 4 is a SEM image of the aluminate fluorescent material according to Comparative Example 2.

TABLE 2

| | Composition Analysis | | | | | | Average Particle Diameter: | Luminous Characteristics | | Peak Emission Wavelength | 535 nm Relative Emission |
|---|---|---|---|---|---|---|---|---|---|---|---|
| | a Ba | b Mg | c Mn | d Al | Na | Na | | Chromaticity Coordinates | | | |
| | (mol) | (mol) | (mol) | (mol) | (mol) | (ppm) | D50 (μm) | x | y | (nm) | Intensity (%) |
| Comparative Example 1 | 0.96 | 0.48 | 0.47 | 10.00 | 0.02 | 460 | 15.8 | 0.177 | 0.733 | 517 | 49.1 |
| Comparative Example 2 | 0.99 | 0.45 | 0.49 | 10.00 | 0.01 | 230 | 15.7 | 0.177 | 0.731 | 517 | 49.0 |
| Comparative Example 3 | 0.98 | 0.42 | 0.50 | 10.00 | 0.02 | 460 | 15.9 | 0.179 | 0.731 | 516 | 50.5 |
| Example 1 | 0.96 | 0.36 | 0.50 | 10.00 | 0.02 | 460 | 15.7 | 0.185 | 0.729 | 517 | 52.1 |
| Example 2 | 0.96 | 0.29 | 0.50 | 10.00 | 0.02 | 460 | 15.5 | 0.197 | 0.720 | 517 | 56.0 |
| Example 3 | 0.93 | 0.12 | 0.50 | 10.00 | 0.03 | 690 | 16.6 | 0.204 | 0.720 | 517 | 63.8 |
| Example 4 | 0.92 | 0.00 | 0.48 | 10.00 | 0.03 | 690 | 15.8 | 0.216 | 0.713 | 518 | 70.1 |
| Example 5 | 0.95 | 0.00 | 0.48 | 11.50 | 0.03 | 690 | 15.9 | 0.220 | 0.712 | 518 | 72.0 |

As shown in Table 2, the emission spectra of the aluminate fluorescent materials of Examples 1 to 5 exhibited a peak emission in the wavelength range of 517 nm to 518 nm. The light emitted from each of the aluminate fluorescent materials of Examples 1 to 5 has a chromaticity with chromaticity coordinates in a range of 0.180≤x≤0.250, 0.700≤y≤0.730, in the CIE1931 color space, which confirmed the emission of desired green color.

Also, as shown in Table 2, the aluminate fluorescent materials of Examples 1 to 5 contain Mg that satisfy the molar composition ratio b of 0.0≤b≤0.4. The aluminate fluorescent materials of Examples 1 to 5 have emission spectra with relative emission intensities in a range of 51% to 80%, which are higher than that of Comparative Examples 1 to 3, at 535 nm that is longer wavelength side than the peak emission wavelengths. That is, the aluminate fluorescent materials of Examples 1 to 5 were confirmed to have higher emission intensities than that of the aluminate fluorescent materials of Comparative Examples 1 to 3, in the wavelength range greater than the peak emission wavelengths.

As shown in FIG. 2, the aluminate fluorescent materials of Example 4 and Comparative Example 2 exhibited emission spectra with similar peak emission wavelengths, and with respect to each peak emission wavelength, the emission spectrum of the aluminate fluorescent material of Example 4 was slightly wider than that of Comparative Example 2 in a wavelength range greater than the peak emission wavelengths and approximately the same as that of Comparative Example 2 in a wavelength range smaller than the peak emission wavelengths. That is, compared to the aluminate fluorescent material of Comparative Example 2, the aluminate fluorescent material of Example 4 was confirmed to have greater emission intensity especially in a wavelength range greater than the peak emission wavelengths.

Significant difference in the shapes and sizes of the particles in appearance was not seen in the aluminate fluorescent material according to Example 3 shown in the SEM image in FIG. 3 and the aluminate fluorescent material according to Comparative Example 2 shown in the SEM image in FIG. 4.

Evaluation of Light Emitting Device

Light Emitting Device

Light emitting devices 100 using the aluminate fluorescent materials of Examples and Comparative Examples were produced, respectively. Each of the aluminate fluorescent materials of the Examples and the Comparative Examples was indicated as a first fluorescent material 71, and a red $K_2SiF_6$:Mn fluorescent material was indicated as a second fluorescent material 72. A nitride semiconductor light emitting element having a main wavelength in a range of 454.4 nm to 455.4 nm was sealed by a fluorescent material member 50 that is a silicon resin having the first fluorescent material 71 and the second fluorescent material 72 dispersed therein, to produce each surface-mount type light emitting device 100 configured to emit light with chromaticity coordinates of approximately (x, y)=(0.262, 0.223). The content amount (pts.mass) of each of the fluorescent materials 70 (a sum of the first fluorescent material 71 and the second fluorescent material 72) with respect to 100 pts.mass of the silicone resin is shown in Table 3. The content ratio of the first fluorescent material 71 and the second fluorescent material 72, that is, the ratio of each fluorescent material with respect to the total amount of the first fluorescent material 71 and the second fluorescent material 72 as 100 mass %, was set to satisfy (first fluorescent material 71): (second fluorescent material 72)=97 to 80:3 to 20.

Emission Chromaticity

Emission spectrum of each of the light emitting devices respectively using corresponding one of the aluminate fluorescent materials of the Examples and the Comparative Examples was measured using a fluorescence spectrometer to obtain the chromaticity coordinates x and y in the CIE1931 color space. The results are shown in Table 3.

DCI Gamut Coverage

The emission spectrum of each of the light emitting devices of the Examples and the Comparative Examples and a transmittance curve of an appropriate color filter were simulated together to calculate the chromaticity coordinates (x, y) of three primary colors: red (R), green (G), and blue (B), to obtain the area of a triangle formed by connecting the chromaticity coordinates of RGB in the CIE1931 color space. The ratio of the area of the triangle to the color gamut indicated by DCI was calculated to obtain the DCI gamut coverage (%) (measured value). The DCI gamut coverage (%) of Comparative Example 2 was assumed 100%, the DCI gamut coverages (%) (relative values) of Examples 1 to 5 and Comparative Examples 1 and 3 were calculated. The relative values of DCI gamut coverage (%) are shown in Table 3. The simulation was conducted with the use of three appropriate color filters, but almost same relative values of DCI gamut coverage (%) between them were obtained in each of the examples and the comparative examples.

TABLE 3

| | Fluorescent material/Resin (pts.mass) | Chromaticity Coordinates x | Chromaticity Coordinates Y | DCI gamut coverage (%) |
|---|---|---|---|---|
| Comparative Example 1 | 138.0 | 0.262 | 0.223 | 100.1 |
| Comparative Example 2 | 135.1 | 0.262 | 0.223 | 100.0 |
| Comparative Example 3 | 132.2 | 0.262 | 0.223 | 100.1 |
| Example 1 | 130.4 | 0.262 | 0.223 | 100.7 |
| Example 2 | 130.4 | 0.262 | 0.223 | 101.0 |
| Example 3 | 128.9 | 0.262 | 0.223 | 102.2 |
| Example 4 | 125.5 | 0.262 | 0.223 | 102.9 |
| Example 5 | 139.2 | 0.262 | 0.223 | 103.5 |

As shown in Table 3, Examples 1 to 5 exhibit larger DCI gamut coverages (%) than that of Comparative Examples 1 to 3, indicating the aluminate fluorescent materials of Examples 1 to 5 have been improved to have chromaticities that can reproduce wide range of colors on the chromaticity coordinates as the fluorescent material used in the light emitting devices for backlight of liquid crystal displays.

Such light emitting devices are in demand in a wide range of fields such as general lighting, on-vehicle lighting, displays, backlights for liquid crystal devices. The aluminate fluorescent material according to an embodiment of the present disclosure has an improved chromaticity upon being excited by light in a range of near-ultraviolet to blue region, and a wider region on the chromaticity coordinates can be reproduced. Thus, such light emitting devices may be suitably used in the backlight light source of liquid crystal that can be used in high definition liquid crystal display devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. An aluminate fluorescent material having a composition represented by the formula $X1_a Mg_b Mn_c Al_d O_{a+b+c+1.5d}$, wherein X1 is at least one element selected from the group consisting of Ba, Sr, and Ca; and a, b, c, and d satisfy $0.5 \le a \le 1.0$, $0.00 \le b \le 0.38$, $0.30 \le c \le 0.60$, $8.5 \le d \le 13.0$, and $9.0 \le b+c+d \le 14.0$; wherein an emission spectrum of the aluminate fluorescent material has a peak emission intensity at a wavelength in a range of 505 nm to 550 nm, and a relative emission intensity at 535 nm in the emission spectrum with respect to the peak emission intensity is in a range of 51% to 80%.

2. The aluminate fluorescent material according to claim 1, wherein the composition is represented by the formula $(Ba_{1-m} Sr_m)_a Mg_b Mn_c Al_d O_{a+b+c+1.5d}$, wherein m satisfies $0.0 \le m \le 1.0$.

3. The aluminate fluorescent material according to claim 1, wherein b, c, d satisfy $0.00 \le b \le 0.15$, $0.4 \le c \le 0.6$, and $9.0 \le d \le 13.0$.

4. The aluminate fluorescent material according to claim 1, wherein light emitted from the aluminate fluorescent material has a chromaticity with chromaticity coordinates in a range of $0.180 \le x \le 0.250$ and $0.700 \le y \le 0.730$ in the CIE 1931 color space.

5. The aluminate fluorescent material according to claim 1, wherein an emission spectrum of the aluminate fluorescent material has a peak emission intensity at a wavelength in a range of 515 nm to 523 nm.

6. A light emitting device comprising:
the aluminate fluorescent material according to claim 1; and
an excitation light source.

7. The light emitting device according to claim 6, wherein the excitation light source is to emit light which has a peak emission wavelength in a range of 380 nm to 485 nm.

* * * * *